(12) United States Patent
Saito et al.

(10) Patent No.: US 11,769,754 B2
(45) Date of Patent: Sep. 26, 2023

(54) MANUFACTURING METHOD FOR SEMICONDUCTOR APPARATUS AND SEMICONDUCTOR APPARATUS

(71) Applicant: CANON KABUSHIKI KAISHA, Tokyo (JP)

(72) Inventors: Tatsuya Saito, Kawasaki (JP); Takayuki Sumida, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/694,909

(22) Filed: Nov. 25, 2019

(65) Prior Publication Data

US 2020/0176421 A1 Jun. 4, 2020

(30) Foreign Application Priority Data

Nov. 29, 2018 (JP) .................................. 2018-224275

(51) Int. Cl.
| | |
|---|---|
| *H01L 25/065* | (2023.01) |
| *H01L 23/66* | (2006.01) |
| *H01L 23/538* | (2006.01) |
| *H01L 21/768* | (2006.01) |
| *H01L 23/00* | (2006.01) |

(52) U.S. Cl.
CPC .... *H01L 25/0657* (2013.01); *H01L 21/76805* (2013.01); *H01L 21/76898* (2013.01); *H01L 23/5389* (2013.01); *H01L 23/66* (2013.01); *H01L 24/27* (2013.01); *H01L 2224/27848* (2013.01); *H01L 2924/00* (2013.01)

(58) Field of Classification Search
CPC ............... H01L 21/76898; H01L 25/50; H01L 25/0657
See application file for complete search history.

(56) References Cited

U.S. PATENT DOCUMENTS

| | | | | |
|---|---|---|---|---|
| 7,262,082 | B1 * | 8/2007 | Lin ....................... | H01L 25/105 438/109 |
| 9,129,963 | B1 * | 9/2015 | Yang ................... | H01L 23/5329 |
| 9,831,164 | B2 * | 11/2017 | Moon ............... | H01L 23/49827 |
| 10,128,168 | B2 * | 11/2018 | Choi ..................... | H01L 23/481 |
| 10,529,664 | B2 * | 1/2020 | Lu ........................... | H01L 24/11 |

(Continued)

FOREIGN PATENT DOCUMENTS

| | | |
|---|---|---|
| CN | 101609828 A | 12/2009 |
| JP | 60154642 A | 8/1985 |

(Continued)

*Primary Examiner* — Michele Fan
(74) *Attorney, Agent, or Firm* — Canon U.S.A., Inc., IP Division

(57) ABSTRACT

A manufacturing method for a semiconductor apparatus sequentially includes bonding a first chip and a second chip together using an adhesive. The first chip includes a first electrode and has a protrusion, and the second chip has a recess. In the bonding, the first chip and the second chip are bonded together in such a manner that the protrusion is positioned into the recess. Further, the method includes forming a through hole in the second chip to expose the first electrode, the first surface being opposite to a second surface having the recess, and forming the second electrode which is electrically connected to the first electrode, in the through hole.

11 Claims, 9 Drawing Sheets

(56) References Cited

U.S. PATENT DOCUMENTS

| | | | |
|---|---|---|---|
| 2005/0023675 A1* | 2/2005 | Umemoto | H01L 23/481 257/729 |
| 2005/0263869 A1* | 12/2005 | Tanaka | H01L 24/16 257/686 |
| 2006/0170112 A1* | 8/2006 | Tanaka | H01L 24/81 257/777 |
| 2006/0278996 A1* | 12/2006 | Trezza | H01L 21/76898 257/777 |
| 2009/0026614 A1* | 1/2009 | Jung | H01L 21/76898 257/738 |
| 2009/0255705 A1* | 10/2009 | Pratt | H01L 25/0657 174/98 |
| 2010/0155940 A1* | 6/2010 | Kawashita | H01L 24/16 257/737 |
| 2011/0001173 A1* | 1/2011 | Ojefors | H03F 1/22 257/290 |
| 2011/0068466 A1* | 3/2011 | Chen | H01L 21/76841 257/737 |
| 2011/0111560 A1* | 5/2011 | Purushothaman | H01L 25/50 438/109 |
| 2013/0075905 A1* | 3/2013 | Choi | H01L 23/481 257/738 |
| 2013/0187275 A1* | 7/2013 | Ohira | H01L 23/481 257/762 |
| 2013/0313674 A1* | 11/2013 | Noda | G01J 5/025 257/467 |
| 2014/0179103 A1* | 6/2014 | Kang | G11C 8/00 438/667 |
| 2015/0091187 A1* | 4/2015 | Reber | H01L 24/16 257/774 |
| 2015/0137238 A1 | 5/2015 | Tsunemi | |
| 2015/0179545 A1* | 6/2015 | Jeong | H01L 24/11 257/621 |
| 2015/0270220 A1* | 9/2015 | Moon | H01L 21/0337 257/737 |
| 2015/0279798 A1* | 10/2015 | Park | H01L 27/11898 257/737 |
| 2017/0025384 A1* | 1/2017 | Park | H01L 25/0657 |
| 2017/0166784 A1* | 6/2017 | Hedrick | H01L 25/50 |
| 2018/0166490 A1 | 6/2018 | Wakiyama | |
| 2019/0157177 A1* | 5/2019 | Ichimura | H01L 24/46 |
| 2021/0098296 A1* | 4/2021 | Dumka | H01L 29/0649 |
| 2021/0134705 A1* | 5/2021 | Ma | H01L 24/06 |
| 2021/0134745 A1* | 5/2021 | Jeong | H01L 24/05 |

FOREIGN PATENT DOCUMENTS

| | | |
|---|---|---|
| JP | 2005-135988 A | 5/2005 |
| JP | 2005-347513 A | 12/2005 |
| JP | 2011-18672 A | 1/2011 |
| JP | 2013058529 A | 3/2013 |

* cited by examiner

MANUFACTURING METHOD FOR SEMICONDUCTOR APPARATUS AND SEMICONDUCTOR APPARATUS

BACKGROUND

Field of the Disclosure

The present disclosure relates to a manufacturing method for semiconductor apparatus and a semiconductor apparatus.

Description of the Related Art

In recent years, a semiconductor apparatus obtained by stacking and bonding together a plurality of substrates has been attracting attention. For such a semiconductor apparatus, misalignment in the boding needs to be reduced. Japanese Patent Application Laid-Open No. 2005-347513 discusses a semiconductor apparatus provided with a semiconductor substrate and a circuit substrate. The semiconductor substrate includes a protruded electrode. The circuit substrate includes a recessed electrode. Japanese Patent Application Laid-Open No. 2005-347513 discusses a technique that can reduce the misalignment by bonding the semiconductor substrate and the circuit substrate with the protruded electrode inserted into the recessed electrode. Japanese Patent Application Laid-Open No. 2005-347513 further discusses a technique of using resin containing conductive filler to bond together and establish conduction between the protruded electrode and the recessed electrode that has the protruded electrode inserted therein.

However, according to Japanese Patent Application Laid-Open No. 2005-347513, it is possible that, when the semiconductor substrate including the protruded electrode is pressed to be bonded, the resin containing conductive filler may spread out to the surroundings, which may cause electrical conduction at an unexpected location and generate leak current. When the leak current occurs, the semiconductor apparatus may not function as a semiconductor apparatus, and the reliability of the semiconductor apparatus is lowered.

SUMMARY

According to an aspect of the present disclosure, a manufacturing method for a semiconductor apparatus includes bonding a first chip including a first electrode and a second chip together using an adhesive, forming a through hole, and forming a second electrode in the through hole. The first chip includes one of a recess and a protrusion. The second chip has the other one of the recess and the protrusion. The first chip and the second chip are so bonded in such a manner that the protrusion is positioned into the recess. The through hole is formed from a first surface of the second chip to expose the first electrode. The first surface of the second chip is opposite to a second surface thereof having the protrusion or the recess. The second electrode is electrically connected to the first electrode.

A semiconductor apparatus according to an embodiment of the present disclosure includes a first chip, a second chip, an adhesive, a through hole, and a second electrode. The first chip includes a first electrode and has one of a recess and a protrusion. The second chip has the other one of the recess and the protrusion. The protrusion is positioned into the recess. The adhesive is disposed between the first chip and the second chip. The through hole is formed in a region overlapping the first electrode in a plan view and penetrates the second chip. The second electrode is formed in the through hole and is electrically connected to the first electrode.

Further features of the present invention will become apparent from the following description of exemplary embodiments with reference to the attached drawings.

DESCRIPTION OF THE EMBODIMENTS

Modes for carrying out the present invention are described below with reference to the drawings. However, the modes described below are merely examples for embodying the technical concept of the present invention and are not intended to limit the present invention. Each of the drawings may include a part in which the size of a member or the positional relationship between members is exaggerated for the sake of illustrative clarity.

Figure 1A:
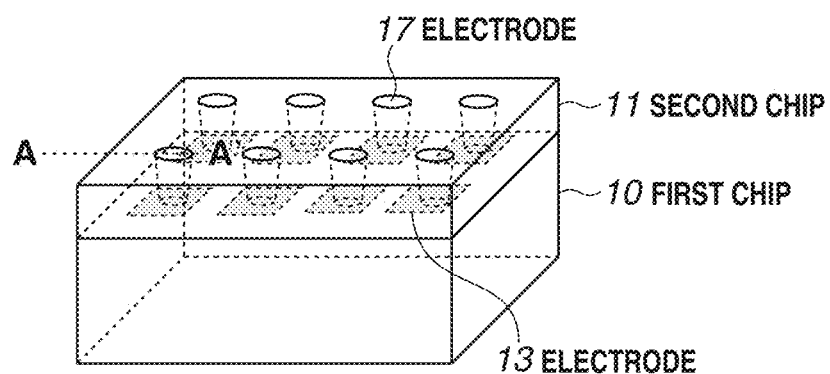
FIGS. 1A and 1B are schematic views illustrating a semiconductor apparatus according to a first exemplary embodiment.
Figure 1B:
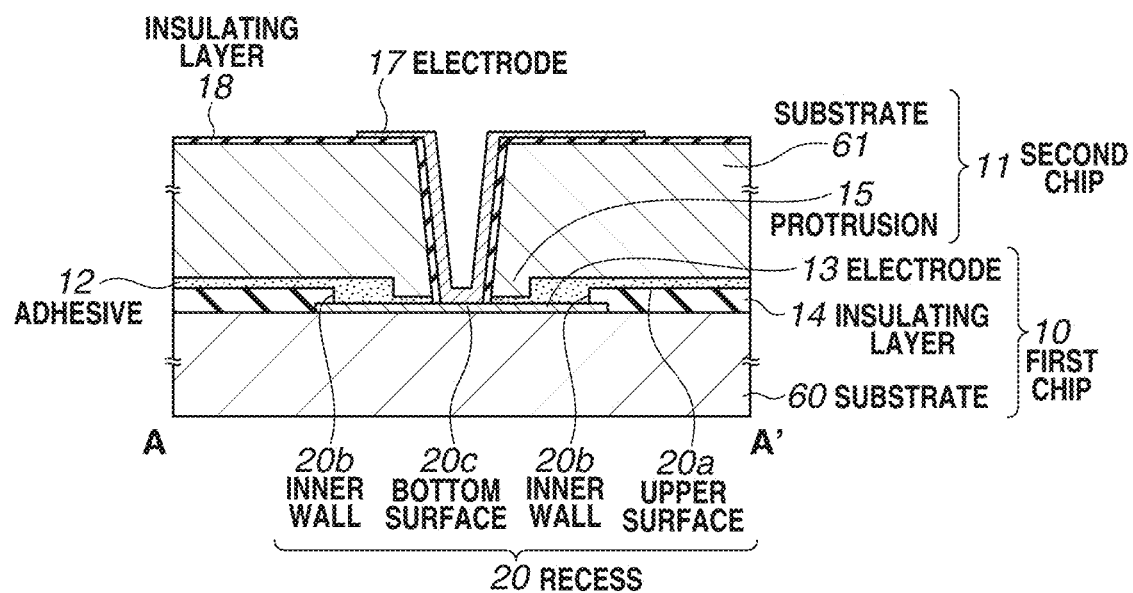

FIG. 1A is a perspective view schematically illustrating a part of a semiconductor apparatus according to a first exemplary embodiment. FIG. 1B is a sectional view taken along the line A-A' in FIG. 1A.

As illustrated in FIGS. 1A and 1B, in the present exemplary embodiment, a recess 20 is provided on a surface of a first chip 10 facing a second chip 11, and a protrusion 15 is provided on a surface (second surface) of the second chip 11 facing the first chip 10. The first chip 10 and the second chip 11 are bonded together via an adhesive 12 so that the protrusion 15 may be positioned in a region surrounded by an inner wall 20b of the recess 20. The second chip 11 has a through hole formed in a region overlapping an electrode 13 (first electrode) in a plan view. The electrode 17 (second electrode) that is electrically connected to the electrode 13 is formed in the through hole.

According to the present exemplary embodiment, a highly reliable semiconductor apparatus can be obtained while misalignment during bonding of a plurality of chips can be reduced. The present exemplary embodiment is detailed below.

In Japanese Patent Application Laid-Open No. 2005-347513, in order to reduce misalignment during bonding of a protruded electrode and a recessed electrode and to establish conduction therebetween, the protruded electrode is inserted into the recessed electrode, and the protruded electrode and the recessed electrode are bonded together by use of resin containing conductive filler. In other words, while the recessed electrode and the protruded electrode ensures alignment precision, the resin containing conductive filler ensures the bonding strength and the conducting state. According to Japanese Patent Application Laid-Open No. 2005-347513, however, it is possible that, when the protruded electrode and the recessed electrode are bonded together, the resin disposed between a recess and a protrusion may spread out to neighboring recessed electrodes and neighboring protruded electrodes, which may cause electrical conduction at an unexpected location and generate leak current. In particular, the conductivity is more likely to decrease when resin containing conductive filler is used than in a case where the protruded electrode and the recessed electrode make direct contact with each other. For that reason, when corresponding chips are bonded together, the protrusion and the recess are pressed toward each other so that the distance therebetween becomes as small as possible. This increases the possibility that the resin containing conductive filler spreads out, thus making the leak more likely.

In contrast, the present exemplary embodiment ensures conductivity in the following manner: after bonding, a through hole is formed so that the first electrode 13 can be exposed, and the second electrode 17 that is electrically connected to the first electrode 13 is formed in the through hole. That is, conduction is enabled by an electrode formed in a through hole instead of an adhesive containing conductive filler or a protruded electrode. Leak current that otherwise flows between an electrode and a neighboring electrode can be thus reduced. In addition, an interlocking structure is employed in which a protrusion and a recess engage with each other. Even in a case where bonding misalignment has occurred, this structure enables the protrusion to stay within a region surrounded by an inner wall of the recess. Accordingly, the bonding misalignment becomes smaller than the width of the recess. As described above, according to the present exemplary embodiment, a highly reliable semiconductor apparatus can be manufactured that reduces misalignment during bonding of a plurality of chips.

The following description describes in detail members of the semiconductor apparatus according to the first exemplary embodiment.

Figure 6A:
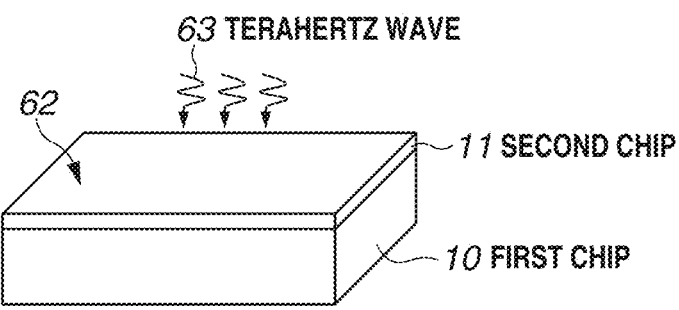
FIGS. 6A, 6B, and 6C are schematic views illustrating a terahertz wave sensor according to an example.
Figure 6B:
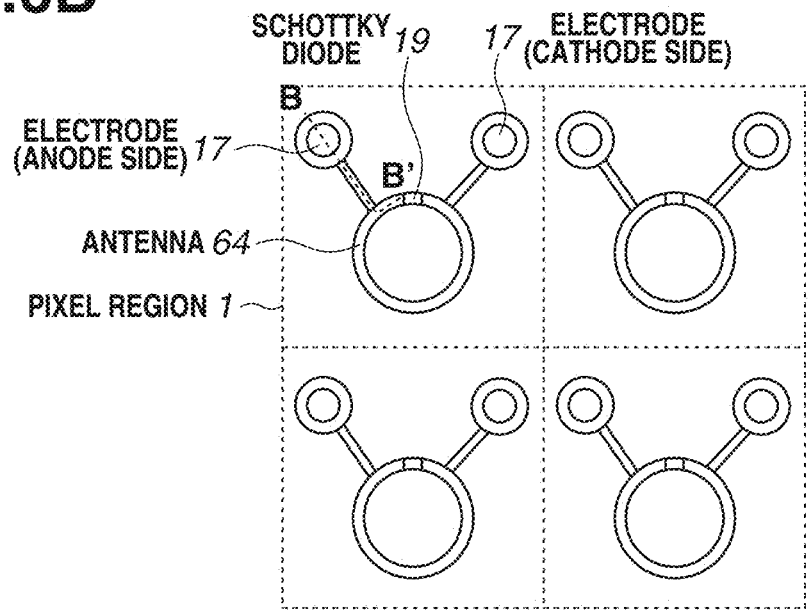
Figure 6C:
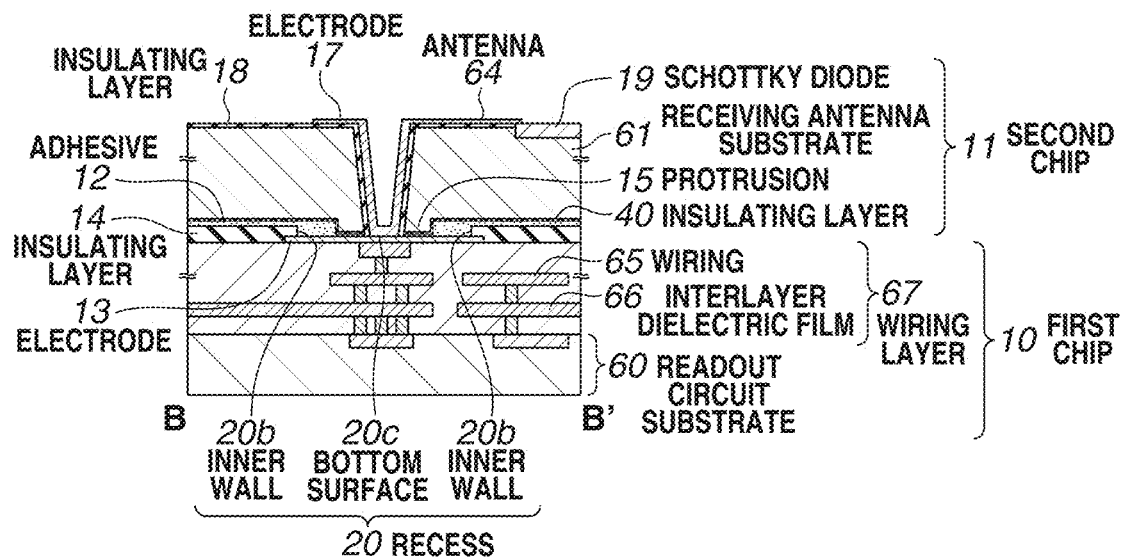

The first chip 10 includes a substrate 60 and the electrode 13. The substrate 60 is made of, for example, a silicon substrate. The first chip 10 may further include a wiring layer 67 between the electrode 13 and the substrate 60 as illustrated in FIG. 6C. The wiring layer 67 includes wiring 65 and an interlayer dielectric film 66.

The first chip 10 is provided with the recess 20 as described above. The recess 20 is composed of a surface (upper surface 20a) of the first chip 10 facing the second chip 11, a bottom surface 20c, and an inner wall 20b connecting the bottom surface 20c and the upper surface 20a of the first chip 10 to each other. In FIG. 1B, the recess 20 is formed by the electrode 13 and an insulating layer 14. Specifically, the insulating layer 14 forms the upper surface 20a and the inner wall 20b of the recess 20 while the electrode 13 forms the bottom surface 20c of the recess 20. Since the entire bottom surface 20c of the recess 20 is formed by the electrode 13 as illustrated in FIG. 1B, it is ensured that, even in a case where the protrusion 15 moves inside the inner wall 20b of the recess 20, the electrode 13 can be disposed in a region overlapping the protrusion 15 in the plan view.

The second chip 11 is provided with the protrusion 15 on one side facing the first chip 10. The protrusion 15 constitutes the interlocking structure that interlocks with the recess 20. The protrusion 15 may take the shape of, for example, a rectangular column, a circular column, or a circular cone.

In the present exemplary embodiment, the second chip 11 is formed of a substrate 61, and the protrusion 15 is formed also of the substrate 61. Specifically, the substrate 61 includes a silicon substrate, and the protrusion 15 is formed also of the silicon substrate. In a case where the protrusion 15 is formed of a material different from the silicon, etching conditions need to be changed between the silicon substrate and the different material in the below-described process of forming the through hole. In contrast, when the protrusion 15 is formed of the silicon substrate, the through hole can be formed without changing etching conditions in the process of forming the through hole. The protrusion 15 is formed by, for example, etching the substrate 61.

As illustrated in FIG. 1B, the protrusion 15 and the recess 20 are desirably formed so as to have a one-to-one correspondence therebetween. This because the presence of any such protrusion 15 or recess 20 that does not interlock with a counterpart is not preferable from the aspect of effective utilization of the region of a wafer. However, the number of such protrusions 15 may be smaller than the number of such recesses 20, provided that there is no layout problem. Even in that case, the effect of reducing misalignment between the first chip 10 and the second chip 11 during the bonding can be obtained.

The second chip 11 may take on such a device structure that the chip 11 is provided on a surface thereof opposite to the first chip 10, as. The device structure is, for example, detection unit that includes a photodiode capable of detecting an electromagnetic wave.

The first chip 10 and the second chip 11 are stacked on each other. In a case where the second chip 11 is provided with the device structure, a second chip detection unit and the electrode 13 are electrically connected to each other via the electrode 17 described below.

As described above, the through hole is provided in the second chip 11. The electrode 17 is formed on a side surface of the through hole. In a case where the second chip 11 is provided with the device structure on a side of a first surface of the second chip, the first surface is opposite to a side of the first chip 10. It is preferable that the electrode 17 be continuously formed from the electrode 13 onto the first surface having the device structure thereon. In a case where a silicon substrate is used as the substrate 61 and the through hole is formed in the silicon substrate, an insulating layer 18 is disposed between the silicon substrate and the electrode 17.

An adhesive 12 is disposed between the first chip 10 and the second chip 11. In order to reduce a temperature required for the bonding, the adhesive 12 that hardens at 250° C. or less is preferably used, and the adhesive 12 that hardens at 200° C. or less is more preferably used, as the adhesive 12. As a consequence, heat resistance during heating does not need to be considered so much and the number of options of the materials usable for the first chip 10 and the second chip 11 can be increased. For example, thermosetting resin is used for the adhesive 12. It is preferable that the adhesive 12 be provided also on the upper surface 20a of the recess 20. In this manner, even in a case where the substrate 61 cannot be formed with a sufficient thickness, warpage of the substrate 61 due to stress thereon can be more easily prevented, and the substrate 61 can be less breakable.

Next, with reference to FIGS. 2A to 2D, an example of a manufacturing method for the semiconductor apparatus illustrated in FIGS. 1A and 1B is described.

Figure 2A:
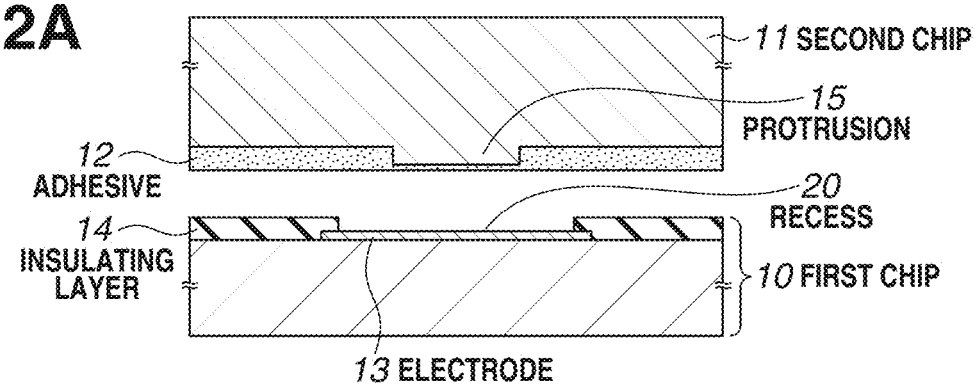
FIGS. 2A to 2D are schematic views illustrating an example of a manufacturing method for the semiconductor apparatus illustrated in FIGS. 1A and 1B.

First, as illustrated in FIG. 2A, the first chip 10 including the electrode 13 and provided with the recess 20 and the second chip 11 provided with the protrusion 15 are prepared. The protrusion 15 can be formed, for example, by etching the second chip 11 as described above. In this process, the first chip 10 and the second chip 11 are preferably prepared with a height 22 of the protrusion 15 which is larger than a height 23 of the recess 20. Subsequently, by a method such as spin coating, the adhesive 12 is applied to the surface of the second chip 11 on a side which has the protrusion 15. Although the adhesive 12 is applied to the second chip 11 in FIG. 2A, the adhesive 12 may be applied to a surface of the first chip 10 on a side which has the recess 20. Alternatively, the adhesive 12 may be applied to both the first chip 10 and the second chip 11.

Figure 2B:
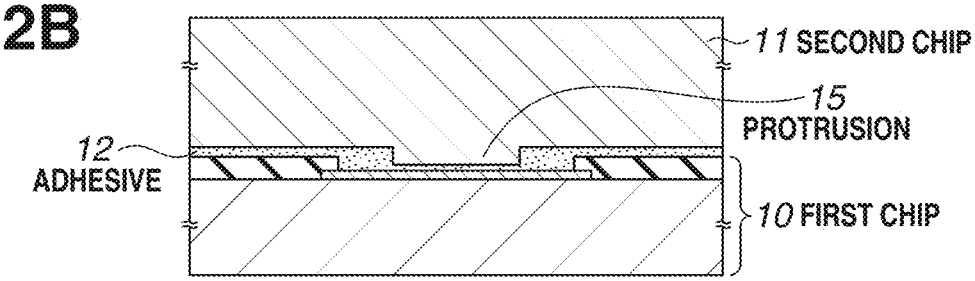

Subsequently, as illustrated in FIG. 2B, the first chip 10 and the second chip 11 are bonded together with the surface of the first chip 10 on the side having the recess 20 and the surface of the second chip 11 on the side having the protrusion 15, facing each other.

In the bonding, the first chip 10 and second chip 11 are aligned with each other by use of alignment marks provided in advance on both of these chips, so that the protrusion 15 of the second chip 11 engages with the recess 20 of the first chip 10. That is, as illustrated in FIG. 2B, the first chip 10 and the second chip 11 are bonded together via the adhesive 12 so that the protrusion 15 may be positioned within a region surrounded by the inner wall 20b of the recess 20.

In a case where the thermosetting resin is used as the adhesive 12, after the two chips are aligned with each other, when the adhesive 12 is heated for a certain period of time or longer with a load applied thereto and becomes hardened, the bonding is completed. Until the adhesive 12 becomes hardened, the adhesive 12 is present in liquid form between the first chip 10 and the second chip 11. Therefore, skid resistance is small between the two chips, and misalignment is likely to occur. In the present exemplary embodiment, the interlocking structure that causes the protrusion 15 of the second chip 11 to interlock with the recess 20 of the first chip 10 is employed as described above, so that the bonding misalignment is smaller than the width of the recess. In other words, the bonding misalignment can be reduced to be within the range of the width of the recess 20.

Figure 2C:
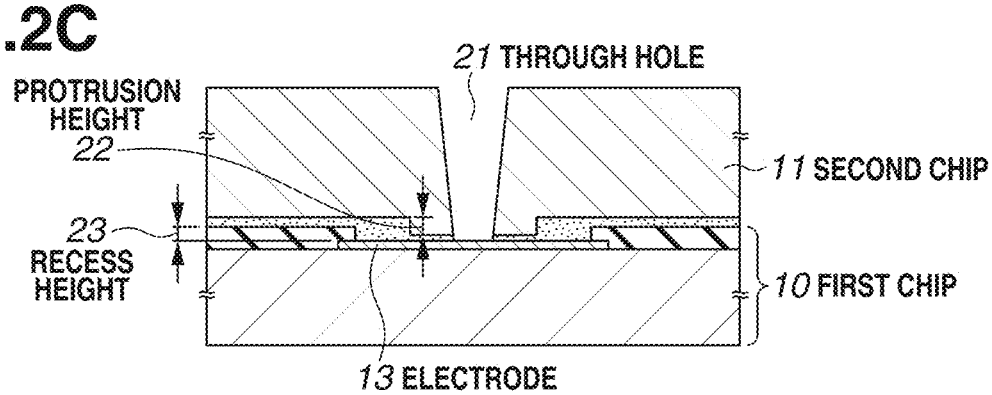

As illustrated in FIG. 2C, a through hole 21 is formed from the side of the second surface of the second chip 11 which is opposite to the first chip 10. The through hole 21 can be formed by, for example, etching. The through hole 21 is formed in a region overlapping the electrode 13 in the plan view, and a part of the second chip 11 is removed so that the electrode 13 can be exposed.

In the present exemplary embodiment, the through hole 21 is formed in a region overlapping the protrusion 15 in the plan view. In the present exemplary embodiment, the height 22 of the protrusion 15 is larger than the height 23 of the recess 20 as described above. In this case, during bonding of the two chips, the adhesive 12 disposed in the region overlapping the protrusion 15 in the plan view is likely to be pushed out into a region surrounding the protrusion 15. Accordingly, the adhesive 12 can be gotten rid of in the region overlapping the protrusion 15 in the plan view, or the thickness of the adhesive 12 can be made very small in that region. Therefore, when the through hole 21 is formed by dry etching, the etching can be applied to a thin region of the adhesive 12. As compared with a case in which the adhesive 12 has the uniform thickness as a whole, the adhesive 12 can be etched more quickly. Although there is concern that reducing the thickness of the adhesive 12 may degrade the bonding strength between the first chip 10 and the second chip 11, the thickness of the adhesive 12 is sufficiently secured in a region other than the region overlapping the protrusion 15 in the plan view in the present exemplary embodiment. Therefore, the bonding strength can be maintained in the region other than the region overlapping the protrusion 15 in the plan view.

Figure 2D:
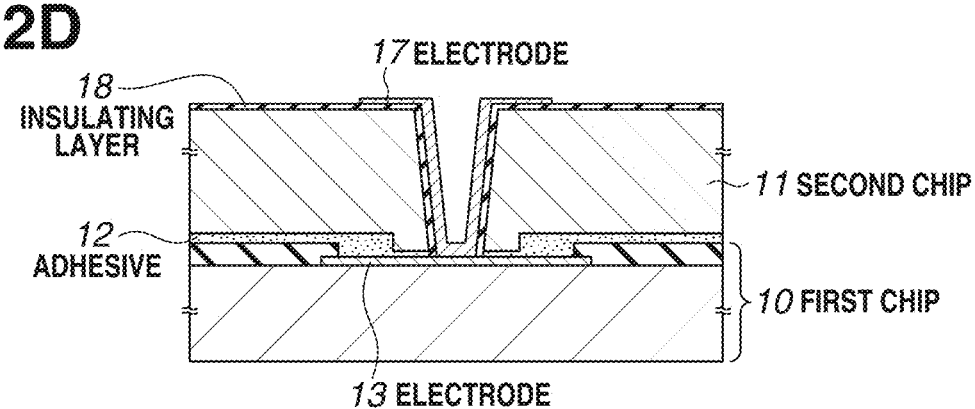

Next, as illustrated in FIG. 2D, the electrode 17 (through electrode) that is electrically connected to the electrode 13 is formed on a side surface of the through hole 21. In the present exemplary embodiment, in order that insulation be secured between the electrode 17 and a silicon substrate included in the second chip 11, the insulating layer 18 is provided before the electrode 17 is provided. The insulating layer 18 is formed of oxide that is formed by, for example, plasma chemical vapor deposition (CVD). The electrode 17 is made of metal that is formed by, for example, sputtering or plating. In FIG. 2D, the electrode 17 is formed along the through hole 21 on the side surface of the through hole 21. However, instead of that example, the electrode 17 that fills the through hole 21 may also be formed.

According to the present exemplary embodiment, bonding misalignment is limited to the region surrounded by the inner wall 20b of the recess 20, which can lessen the likelihood of non-conduction between the electrode 17 and electrode 13 and can assure that the chips bonded together are electrically connected to each other. Furthermore, resin is used as the adhesive 12, which can lessen the likelihood of device break caused by heat. In addition, even if the thickness of the adhesive 12 is small in the region overlapping the protrusion 15 in the plan view, the thickness of the adhesive 12 is sufficiently secured in a region not overlapping the protrusion 15 in the plan view, that is, a region surrounding the protrusion 15 in the plan view. Therefore, warpage of the substrate 61 due to stress is less likely to occur, and a semiconductor apparatus ensuring reliability can be obtained.

<Modifications>

Modifications of the above-described exemplary embodiment are described below. In each of the following modifications, the effect of reducing bonding misalignment can be obtained as in the above-described exemplary embodiment.

Figure 3:
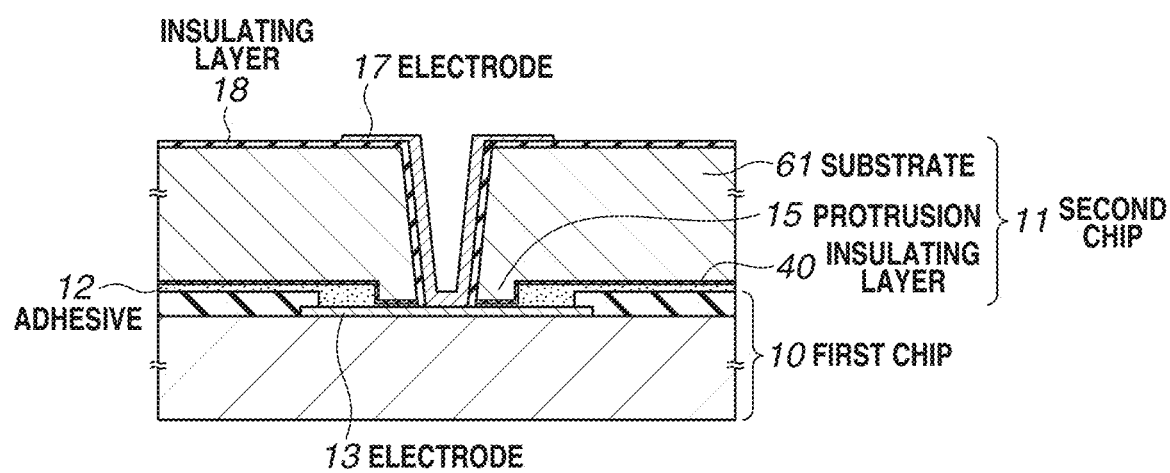
FIG. 3 illustrates a modification of the semiconductor apparatus according to the first exemplary embodiment.

While the protrusion 15 is formed only of the silicon substrate for the second chip 11 in FIG. 1B, the protrusion 15 may alternatively be formed of an insulating layer 40 and the silicon substrate with the insulating layer 40 provided on the protrusion 15 that is made of the silicon substrate as illustrated in FIG. 3. The insulating layer 40 provided between the first chip 10 and the second chip 11 can prevent a short circuit between the first chip 10 and the second chip 11. For example, during bonding of the chips, a void may appear in the adhesive 12 between the protrusion 15 and the bottom surface 20c of the recess 20. In a case where the electrode 17 enters the void and is formed therein, a short circuit occurs between a substrate having the protrusion 15 disposed thereon and a substrate having the recess 20 thereon. In order to deal with this inconvenience, the insulating layer 40 is disposed in the protrusion 15 as illustrated in FIG. 3, which makes it possible to prevent a short circuit between the substrates and to enhance the reliability.

Figure 4:
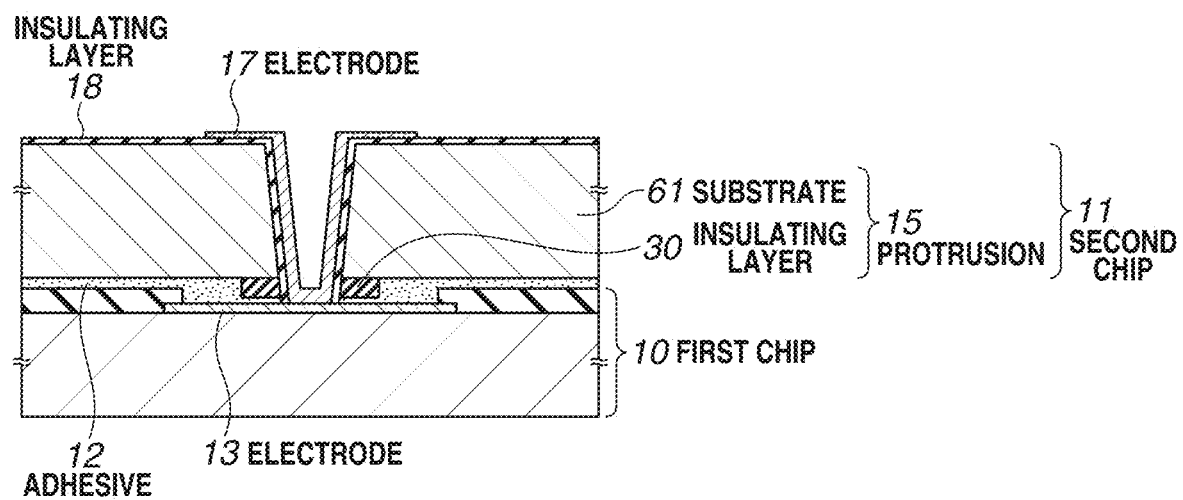
FIG. 4 is a schematic view illustrating another modification of the semiconductor apparatus according to the first exemplary embodiment.

Alternatively, as illustrated in FIG. 4, one surface of the silicon substrate may be formed as a flat surface, and the protrusion 15 may be formed by bonding an insulating layer 30 to the flat surface. In FIG. 4, a surface of the substrate 61 facing the first chip is the flat surface, and the insulating layer 30 is provided on the flat surface. The protrusion 15 is formed of the substrate 61 and the insulating layer 30.

As illustrated in FIGS. 3 and 4, in a case in which the insulating layer 14 or the insulating layer 30 is disposed between the protrusion 15 and the electrode 13, the insulating layer 14 or the insulating layer 30 is removed until the electrode 13 is exposed in the process of forming the through hole.

Figure 5:
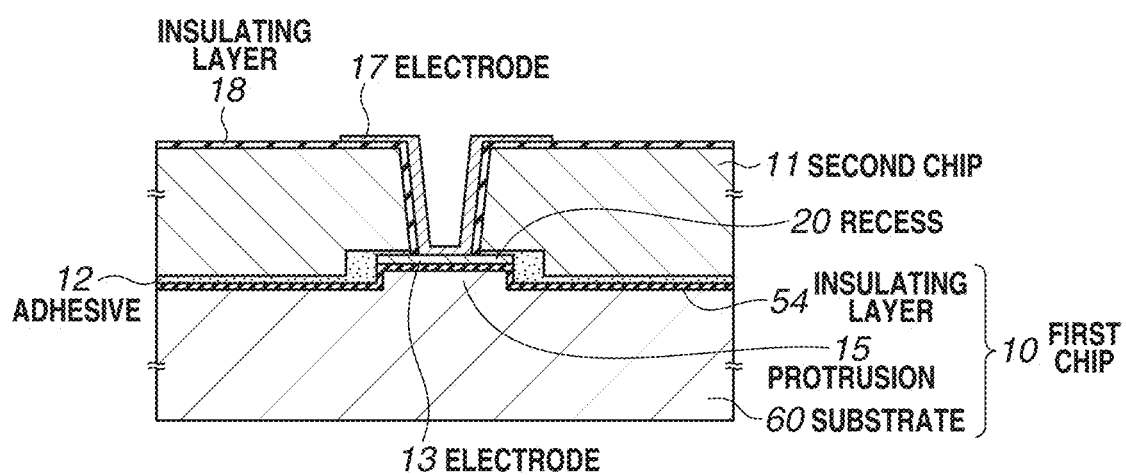
FIG. 5 is a schematic view illustrating still another modification of the semiconductor apparatus according to the first exemplary embodiment.

In another example, as illustrated in FIG. 5, the protrusion 15 may be provided on the first chip 10 and the recess 20 may be provided on the second chip 11. If one of the protrusion 15 and the recess 20 is provided on the first chip 10 and the other one of the protrusion 15 and the recess 20 is provided on the second chip 11, the effect of reducing bonding misalignment between the two chips during boding thereof can be obtained. In a case in which the protrusion 15 is provided on the first chip 10, the first chip 10 includes the protrusion 15, an insulating layer 54, and the electrode 13 formed on the protrusion 15. In such a structure, the protrusion 15 is configured to interlock with the recess 20 provided on the second chip 11. In this case, however, it is possible that, if bonding misalignment has occurred whereby the position of the protrusion 15 has been shifted within a range corresponding to the recess 20 provided on the second chip 11, the electrode 17 may be formed in a position misaligned with the electrode 13 depending on the sizes of the protrusion 15, the electrode 13, and the recess 20. Therefore, it is preferable that, as illustrated in FIG. 1B, the recess 20 be formed on the first chip 10 while the protrusion 15 be formed on the second chip 11 in which the through hole is formed. In a case in which the protrusion 15 is formed on the first chip 10, it is preferable that the region of the recess 20 be made narrow, which makes the bonding misalignment smaller and consequently lessen the likelihood that the electrode 17 is formed in a misaligned position.

Example

The present example is an example in which, as illustrated in FIG. 3, a semiconductor apparatus is manufactured so as to form the protrusion 15 of the substrate 61 and the insulating layer 40, and stack the first chip 10 and the second chip 11 on each other. Specifically, the semiconductor apparatus in the present example is formed as a detector illustrated in FIG. 6A that detects a terahertz wave. With reference to FIGS. 6A to 6C, the semiconductor apparatus according to the example is described.

As illustrated in FIGS. 6A to 6C, the semiconductor apparatus includes the first chip 10 and the second chip 11. The first chip 10 includes the substrate (readout circuit substrate in the present example) 60 and a wiring layer 67. The second chip 11 includes the substrate (receiving antenna substrate in the present example) 61. Specifically, the receiving antenna substrate 61 having a thickness of 60 μm was laminated on the readout circuit substrate 60 having a thickness of 725 μm. An antenna 64 that detects a terahertz wave 63 was disposed on a surface of the receiving antenna substrate 61 which is opposite to the readout circuit substrate 60. The readout circuit substrate 60 includes a complementary metal-oxide semiconductor (CMOS) transistor provided as a readout circuit. The thickness of the receiving antenna substrate 61 was set to 60 μm in consideration of efficiency for detection of a terahertz wave but is a design matter that can be changed as appropriate.

FIG. 6B is an enlarged view of a part of the surface (hereinafter referred to as "photo-sensing surface 62") of the receiving antenna substrate 61 which is formed on a side of the antenna 64. FIG. 6C is a sectional view taken along the line B-B'. As illustrated in FIGS. 6B and 6C, the loop antennas 64 for which Schottky barrier diodes 19 are used, are disposed in a two-dimensional array. One pixel includes the antennas 64, an anode-side electrode 17, and a cathode-side electrode 17. In the present example, a region for each pixel was set to 500 μm by 500 μm, and the loop antennas 64 each having a diameter of 140 μm were used.

The electrode 13 of the readout circuit substrate 60 and the wiring 65 included in the wiring layer 67 are electrically connected to each other via the antenna 64, the anode-side electrode 17, and the cathode-side electrode 17.

A manufacturing method for the terahertz wave sensor according to the present example is described with reference to FIGS. 7A to 7G. FIGS. 8A to 8E are respective enlarged views inside broken-line frames in FIGS. 7A to 7G. FIGS. 8A and 8B correspond to the inside of the broken-line frame in FIG. 7C. FIG. 8C corresponds to the inside of the broken-line frame in FIG. 7D. FIG. 8D corresponds to the inside of the broken-line frame in FIG. 7E, and FIG. 8E corresponds to the inside of the broken-line frame in FIG. 7F.

Figure 7A:
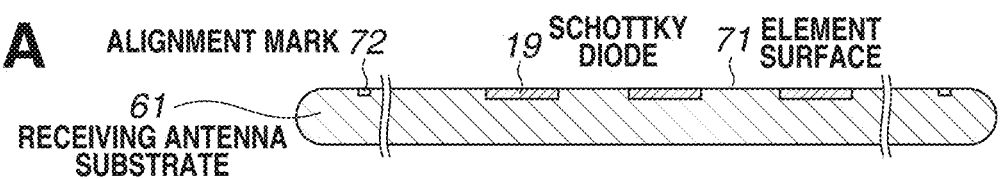
FIGS. 7A to 7G illustrate a manufacturing method for the terahertz wave sensor according to the example.
Figure 8A:
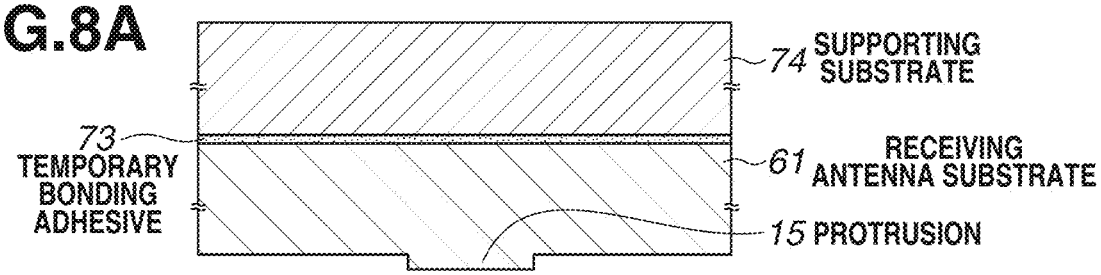
FIGS. 8A to 8E are enlarged views of an interlocking structure and the neighborhood thereof in the manufacturing method illustrated in FIGS. 7A and 7G.
Figure 8B:
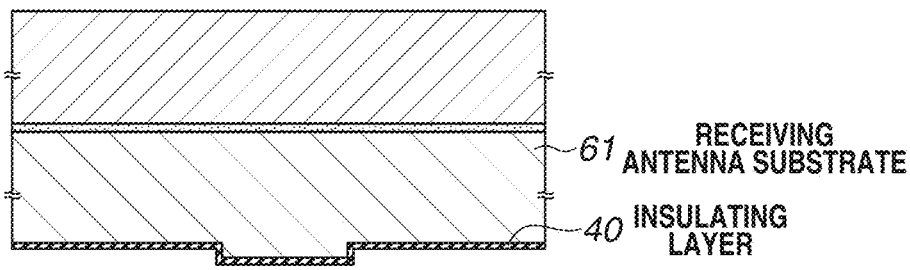
Figure 8C:
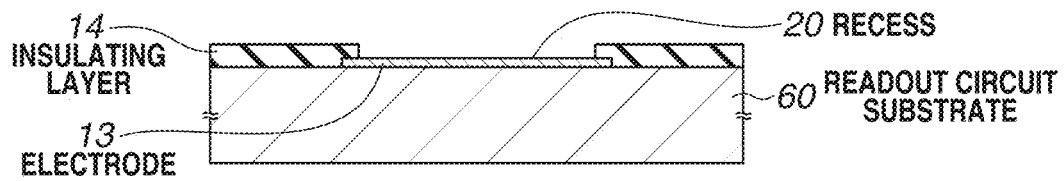
Figure 8D:
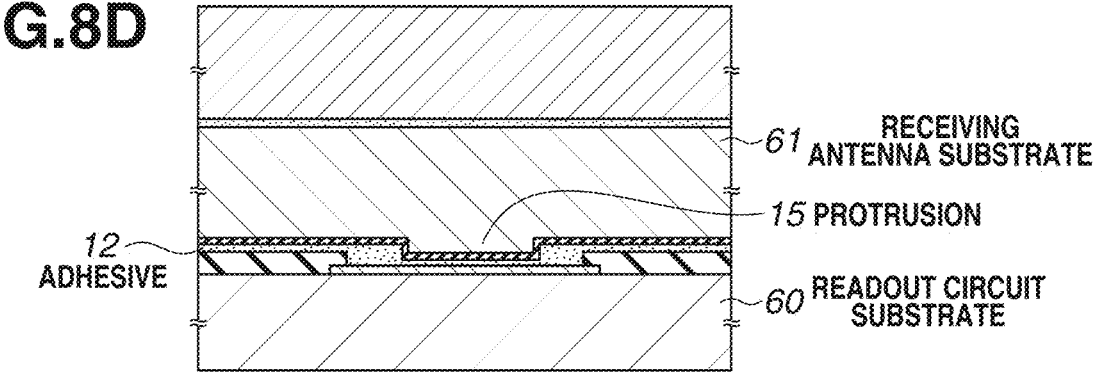

As the receiving antenna substrate 61 illustrated in FIG. 7A, a silicon substrate having a diameter of 200 mm and a thickness of 725 μm was used. On the receiving antenna substrate 61, at least the two-dimensionally arrayed Schottky diodes 19 and an alignment mark 72 used for patterning and bonding with the readout circuit substrate 60 are disposed. The Schottky diodes 19 and the alignment mark 72 are disposed on a light receiving surface (element surface 71) of the receiving antenna substrate 61.

Figure 7B:
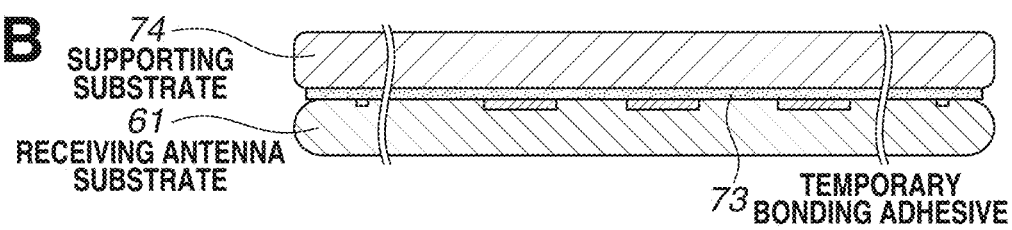

As illustrated in FIG. 7B, the photo-sensing surface of the receiving antenna substrate 61 and a supporting substrate 74 are bonded together using a temporary bonding adhesive 73. As the supporting substrate 74, a supporting glass having a diameter of 200 mm and a thickness of 500 μm was used. As the temporary bonding adhesive 73, LC-5320 manufactured by 3M Company was used.

A release layer is coated with the supporting substrate 74. In the present example, Light-To-Heat-Conversion (LTHC) manufactured by 3M Company was used for the release layer. The supporting substrate 74 can be separated by irradiation of a laser in a process described below. Then, the temporary bonding adhesive 73 is applied to the supporting substrate 74 by spin-coating.

Figure 7C:
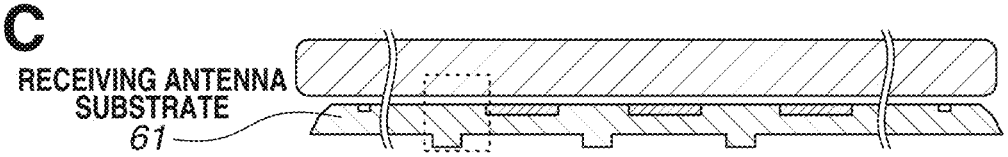

Next, as illustrated in FIG. 7C, a surface of the receiving antenna substrate 61 which is opposite to the light receiving surface (a surface side on which the readout circuit substrate 60 is bonded) was ground. In this process, it is preferable that the thickness of the second chip 11 be reduced to 100 μm or less. This is because time needed for forming the through hole can be reduced. Specifically, in the present example, the surface side of the receiving antenna substrate 61 on which the readout circuit substrate 60 is bonded was ground by use of a back grinding apparatus, and the thickness of the receiving antenna substrate 61 was reduced to 60 μm.

Next, the protrusions 15 is formed on the ground surface of the receiving antenna substrate 61 (the surface side on which the readout circuit substrate 60 is bonded). FIG. 8A is an enlarged view of one protrusion 15 and the neighborhood thereof. In the process of forming the protrusions 15, the protrusions 15 need to be formed so as to correspond to positions in which the through holes are to be formed. In the present example, a double-sided mask aligner was used to form a photoresist pattern by use of the alignment mark 72, and the receiving antenna substrate 61 itself was dry-etched. The protrusions 15 each having a diameter of 60 μm and a height of 1 μm were thus formed.

Then, as illustrated in FIG. 8B, an SiO$_2$ film having a thickness of 100 nm and serving as the insulating layer 40 was deposited by plasma CVD on the surface of the receiving antenna substrate 61 on the side having the protrusions 15.

Figure 7D:
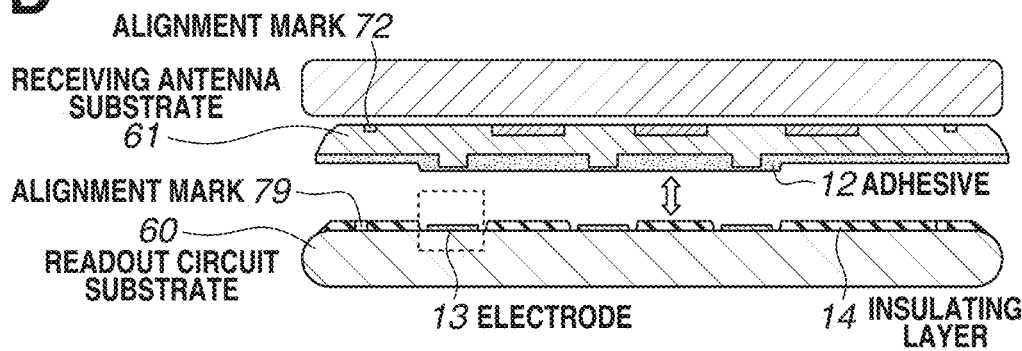

Then, as illustrated in FIG. 7D, a benzocyclobutene (BCB) layer was formed as the adhesive 12 on the surface of the receiving antenna substrate 61 on the side having the protrusions 15. As the BCB layer, CYCLOTENE 3022-35 (manufactured by The Dow Chemical Company) was applied by spin-coating so as to have a thickness of 1.3 μm.

Then, the receiving antenna substrate 61 and the readout circuit substrate 60 are bonded together across the adhesive 12. First, these materials were baked for three minutes on a hot plate heated to 140° C., and thereafter, the receiving antenna substrate 61 and the readout circuit substrate 60 were bonded together. As the readout circuit substrate 60, a silicon substrate having a diameter of 200 mm and a thickness of 725 μm was used.

The wiring layer 67 including the wiring 65 and the interlayer dielectric film 66 is bonded to one surface of the silicon substrate used as the readout circuit substrate 60. Between the wiring 65 and the CMOS transistor, conduction is established. An alignment mark 79 to be used during bonding with the receiving antenna substrate 61 is disposed on the silicon substrate used as the readout circuit substrate 60. The readout circuit substrate 60 is formed as a circuit substrate capable of reading out, on a pixel-to-pixel basis, respective signals from the Schottky diodes 19 disposed on the receiving antenna substrate 61. Accordingly, pixel circuits was formed on the readout circuit substrate 60 with pitches of 500 μm so as to correspond to the two-dimensionally arrayed Schottky diodes 19.

FIG. 8C is an enlarged view of one recess 20 disposed on the readout circuit substrate 60 and the neighborhood thereof. As illustrated in FIG. 8C, the recess 20 is formed by the insulating layer 14 and the corresponding electrode 13 so as to constitute the interlocking structure with the corresponding protrusion 15, and a part of the electrode 13 is exposed to the bottom surface 20c of the recess 20. The recess 20 was shaped like a circular column having a diameter of 120 μm and a depth of 0.9 μm.

Next, as illustrated in FIG. 7D, bonding alignment is achieved by use of the alignment mark 72 on the receiving antenna substrate 61 and the alignment mark 79 on the readout circuit substrate 60. Thereafter, the receiving antenna substrate 61 and the readout circuit substrate 60 were bonded together using a wafer bonder (EVG520IS). Specifically, the receiving antenna substrate 61 and the readout circuit substrate 60 were held at a temperature of 200° C. for two hours with a load of 3 kN applied thereto. The BCB layer used as the adhesive 12 was thus hardened, and the bonding therebetween was completed. As a result of the bonding alignment, the bonding can be achieved in a state illustrated in FIG. 8D in which the protrusion 15 on the receiving antenna substrate 61 and the recess 20 on the readout circuit substrate 60 constitute the interlocking structure.

Figure 9:
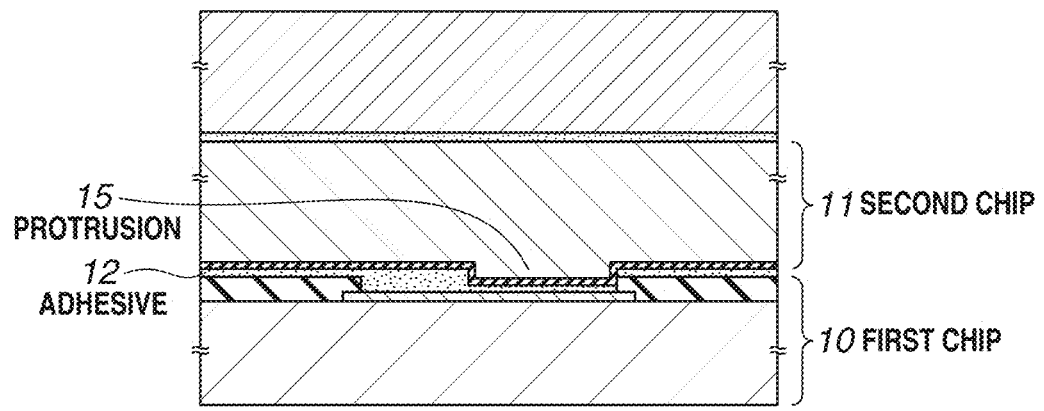
FIG. 9 illustrates a state in which bonding misalignment has been reduced by the interlocking structure.

There may be a case in which bonding misalignment occurs because the receiving antenna substrate 61 and the readout circuit substrate 60 slip on each other before the adhesive 12 hardens. The bonding was tried using several kinds of materials. As a result, it was confirmed that the interlocking structure in the present example acted to reduce bonding misalignment within the range of the recess 20 and the protrusion 15 stayed inside the inner wall 20b of recess 20 without misalignment. Even when bonding misalignment occurs, the protrusion 15 stopped at the inner wall 20b of the recess 20 as illustrated in FIG. 9. It was thereby confirmed that the effect of the interlocking structure can be obtained.

Figure 7E:
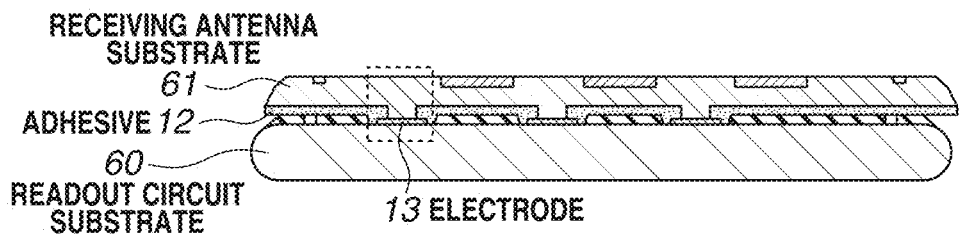

Then, as illustrated in FIG. 7E, the supporting substrate 74 was separated from the receiving antenna substrate 61. Specifically, a surface of the supporting substrate 74 which is opposite to the side on which the receiving antenna substrate 61 is bonded was irradiated with a laser. LTHC described above was thus heated, whereby the supporting substrate 74 was separated from the temporary bonding adhesive 73. Thereafter, the temporary bonding adhesive 73 that remained on the receiving antenna substrate 61 was removed using a peeling tape and a solvent.

Figure 7F:
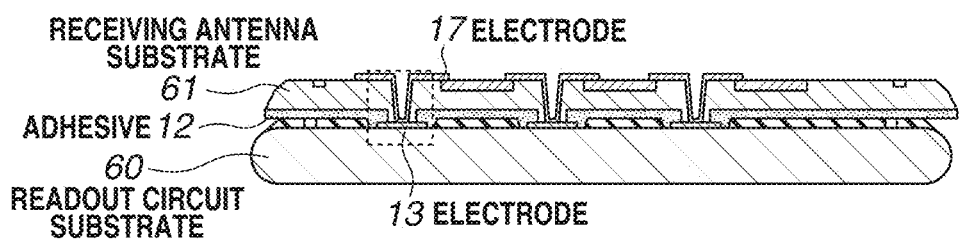

Subsequently, as illustrated in FIG. 7F, through holes are formed from the element surface 71 of the receiving antenna substrate 61 until the electrodes 13 are exposed. Specifically, the receiving antenna substrate 61, the insulating layer 40, and the adhesive 12 disposed between the protrusions 15 and the readout circuit substrate 60, were removed by dry etching. The electrodes 13 were thus exposed from the receiving antenna substrate 61.

Figure 8E:
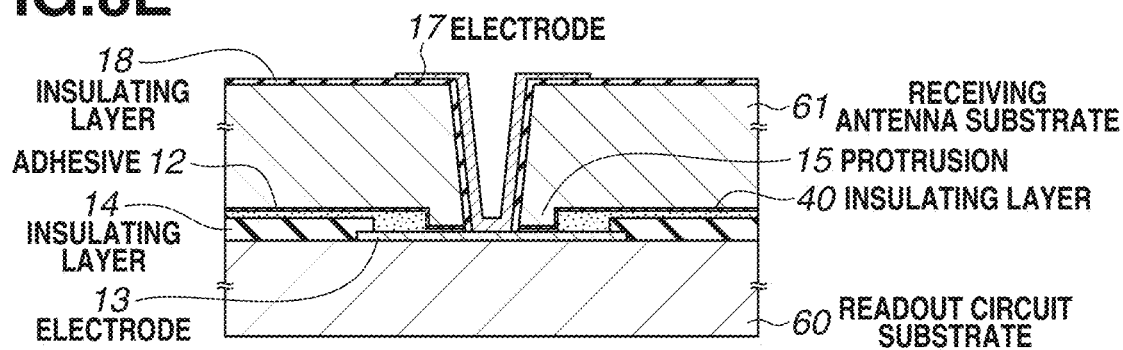

Subsequently, the electrodes 17 were formed continuously from the electrodes 13 to electrodes of the Schottky diodes 19. The electrodes 17 electrically connect the Schottky diodes 19 to the wiring 65 included in the wiring layer 67 disposed between the readout circuit substrate 60 and the receiving antenna substrate 61. The antenna 64 includes parts of the corresponding electrodes 17. As illustrated in FIG. 8E, the electrode 17 is connected to the electrode 13 in a region overlapping the protrusion 15 in a plan view.

In order to form the electrodes 17, first, the receiving antenna substrate 61, the insulating layer 40 and the adhesive 12 disposed between the protrusion 15 and the receiving antenna substrate 61 were removed by dry etching. Subsequently, the through holes are formed in the receiving antenna substrate 61 until the electrodes 13 were exposed from the readout circuit substrate 60. Subsequently, a film which is the material for the insulating layers 18 was formed by plasma CVD on side surfaces of the through holes in order that insulation be secured between the electrode 17 and the receiving antenna substrate 61. As the material for the insulating layer 18, specifically, tetraethoxysilane (TEOS) was used. The electrodes 17 made of Cu were then formed by a plating method.

Figure 7G:
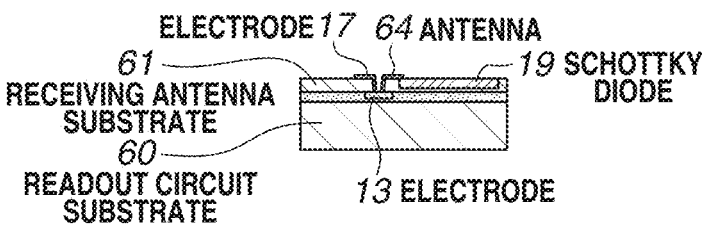

Subsequently, as illustrated in FIG. 7G, chips that have the receiving antenna substrate 61 and the readout circuit substrate 60 bonded together were cut out by dicing. Thus, the terahertz wave sensor illustrated in FIG. 6A was obtained.

A second example is described. The semiconductor apparatus described in the foregoing example can be suitably applied to, for example, an image forming apparatus (image capturing apparatus, or camera). Specifically, a target object, an image of which is to be captured, is irradiated with terahertz waves by an oscillator outside the image forming apparatus. Subsequently, the image forming apparatus receives terahertz waves incident thereon as a result of reflection of the foregoing terahertz waves on the target object. An image processing unit then acquires electric signals output via an output terminal from an output circuit in the image forming apparatus, and the image processing unit forms an image based on the electric signals. In this case, the electric signals are based on terahertz waves received (detected) by a receiver according to the foregoing exemplary embodiment and the foregoing example. Those signals therefore contain a low level of noise and include highly sensitive information. The image forming apparatus is accordingly capable of forming (capturing) an image that contains a low level of noise and is highly sensitive.

The exemplary embodiment and the examples of the present invention are described above. However, the present invention is not limited to the exemplary embodiment and those examples and can be variously modified and changed within the gist of the present invention.

In the above, a terahertz wave sensor is taken as an example. However, the present invention is not limited to the example. For example, the present invention is applicable to electromagnetic wave sensors, such as an infrared radiation sensor, other than the terahertz wave sensor.

According to the present invention, a manufacturing method for a semiconductor apparatus and a semiconductor apparatus can be provided that reduce positional shift (misalignment) during bonding of a plurality of chips and that are highly reliable.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2018-224275, filed Nov. 29, 2018, which is hereby incorporated by reference herein in its entirety.

What is claimed is:

1. A semiconductor apparatus comprising:
   a first chip including a first electrode and having a recess, the recess having a portion overlapping the first electrode in a plan view;
   a second chip including a silicon substrate and having a protrusion, the protrusion being positioned into the portion of the recess overlapping the first electrode in the plan view;
   a through hole formed in a region overlapping the first electrode in the plan view and extending through the silicon substrate; and
   a second electrode formed in the through hole and electrically connected to the first electrode,
   wherein the protrusion includes at least a silicon and the through hole is provided inside the protrusion.

2. The semiconductor apparatus according to claim 1, wherein the recess has an inner wall and a bottom surface, wherein the first electrode is exposed from the bottom surface of the recess, and wherein the through hole is formed in a region overlapping the first electrode and the protrusion in the plan view.

3. The semiconductor apparatus according to claim 2, wherein the first chip includes an insulating layer, and wherein the recess is formed by the first electrode and the insulating layer.

4. The semiconductor apparatus according to claim 1, wherein the second electrode is formed continuously from the first electrode to a first surface of the second chip, the first surface being opposite to a second surface of the second chip having the protrusion.

5. The semiconductor apparatus according to claim 1, wherein a height of the protrusion is higher than a height of the recess.

6. The semiconductor apparatus according to claim 1, wherein the second chip comprises a detection unit configured to detect an electromagnetic wave, wherein the silicon substrate is disposed between the detection unit and the first chip, and wherein the second electrode is formed continuously from the first electrode to the detection unit.

7. The semiconductor apparatus according to claim 6, wherein the second chip further comprises an output circuit configured to output an electric signal to the outside, the electric signal being based on a terahertz wave received by an antenna that includes the second electrode.

8. An image forming apparatus comprising:
   the semiconductor apparatus according to claim 7; and
   an image processing unit configured to form an image based on the electric signal.

9. The semiconductor apparatus according to claim 1, wherein an adhesive is disposed between the first chip and the second chip.

10. The semiconductor apparatus according to claim 9, wherein the adhesive has a smaller thickness in a region overlapping the protrusion in the plan view than in a region not overlapping the protrusion in the plan view.

11. The semiconductor apparatus according to claim 1, wherein the second chip further includes an insulating layer provided at a side surface of the silicon substrate which is penetrated by the through hole.

* * * * *